United States Patent [19]

Taylor

[11] 4,360,744
[45] Nov. 23, 1982

[54] SEMICONDUCTOR SWITCHING CIRCUITS

[76] Inventor: Brian E. Taylor, 169 Fambridge Rd., Maldon, Essex, England, CM9 GBU

[21] Appl. No.: 153,005

[22] Filed: May 27, 1980

[30] Foreign Application Priority Data

Jun. 1, 1979 [GB] United Kingdom ............... 7919139

[51] Int. Cl.³ .................. H03K 3/26; H03K 17/60
[52] U.S. Cl. .................... 307/254; 307/270; 307/546; 307/570; 307/300
[58] Field of Search ............ 307/254, 270, 300, 544, 307/549, 566, 567, 568, 570; 330/311, 297, 298; 328/67

[56] References Cited

U.S. PATENT DOCUMENTS

| | | | |
|---|---|---|---|
| 3,872,327 | 3/1975 | Rudert et al. | 307/300 |
| 3,904,975 | 9/1975 | Satoh | 307/546 |
| 3,986,060 | 10/1976 | Nishizawa et al. | 330/298 |
| 4,079,336 | 3/1978 | Gross | 330/311 |
| 4,109,166 | 8/1978 | Clark, Jr. et al. | 307/300 |
| 4,234,805 | 11/1980 | Carlsen | 307/300 |
| 4,236,120 | 11/1980 | White | 307/297 |
| 4,250,463 | 2/1981 | Foster | 330/311 |

Primary Examiner—Stanley D. Miller
Assistant Examiner—B. P. Davis

[57] ABSTRACT

A semiconductor switching circuit is disclosed which switches current from a power source through a load in response to switching control signals applied to first and second semiconductor switching devices, such as transistors. The first and second transistors are connected in series and the first transistor has a higher voltage rating but lower switching speed than the second transistor. A voltage limiting device, such as a further transistor, effectively limits the voltage across the second transistor so that its voltage rating is not exceeded and also so as to remove stored charge in the base region of the first transistor which would otherwise tend to hold the transistor on. This technique increases the switching speed of the circuit and allows a high voltage and current handling device to be selected for the first transistor, and a high current, high speed device to be selected for the second transistor.

6 Claims, 5 Drawing Figures

SEMICONDUCTOR SWITCHING CIRCUITS

BACKGROUND OF THE INVENTION (1) Field of the Invention

The present invention relates to semiconductor switching circuits and more particularly to a circuit for optimizing the switching speed of a high-voltage semiconductor switching device, such as a high-voltage transistor.

(2) Brief Description of the Prior Art

The use of a semiconductor device, such as a transistor, in the switching mode involves a compromise between the speed of switching, the maximum voltage to be handled by the transistor and the maximum current to be passed by the transistor. In general, the higher the voltage and current handling capacity of a transistor, the lower the switching speed available from such a device.

In certain applications, such as switching-mode power supplies, there is a requirement for switching circuits which are capable of operating at high speed. Where it is desired to provide a high power output from such a supply, it will be seen that the switching circuits must be able to handle high voltages and currents as well as operate at high speeds.

SUMMARY OF THE INVENTION

It is an object of the present invention to provide a switching circuit using a semiconductor switching device of inherently low speed whose switching speed is increased by virtue of the circuit, without the need to provide a reverse drive for removing charge stored in the device, and wherein the circuit is capable of operation over a wide range of switched currents.

In accordance with the invention there is provided a semiconductor switching circuit for switching current from a power source through a load in response to switching control signals applied thereto; the circuit comprises first and second switching devices connected in series to switch the current through the load. The first switching device may have a higher voltage rating but lower inherent switching speed than the second switching device, both switching devices being responsive to the control signals applied thereto to switch together. A voltage limiting means is arranged to limit the voltage across the second switching device so that its voltage rating is not exceeded and also so as to remove stored charge in the first switching device, thereby increasing the switching speed of the circuit.

It will accordingly be seen that the first switching device is chosen for its high voltage handling capability, the second switching device being chosen for its switching parameters. Since the voltage limiting means sets a maximum to the voltage presented across the second device, the operational voltage rating of the second device may therefore be very low compared to that of the first device. A circuit may be designed in accordance with the technique utilizing high current handling devices and such a circuit will provide rapid switching at high voltage and currents.

BRIEF DESCRIPTION OF THE DRAWINGS

Other objects and advantages will become apparent from a study of the following specification, when viewed in the light of the accompanying drawing, in which.

DETAILED DESCRIPTION

Figure 1:
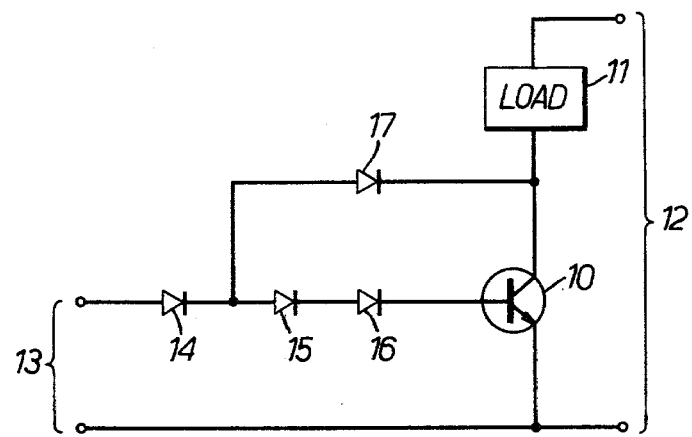
FIGS. 1 and 2 are electrical circuit diagrams of two switching circuits of the prior art.
Figure 2:
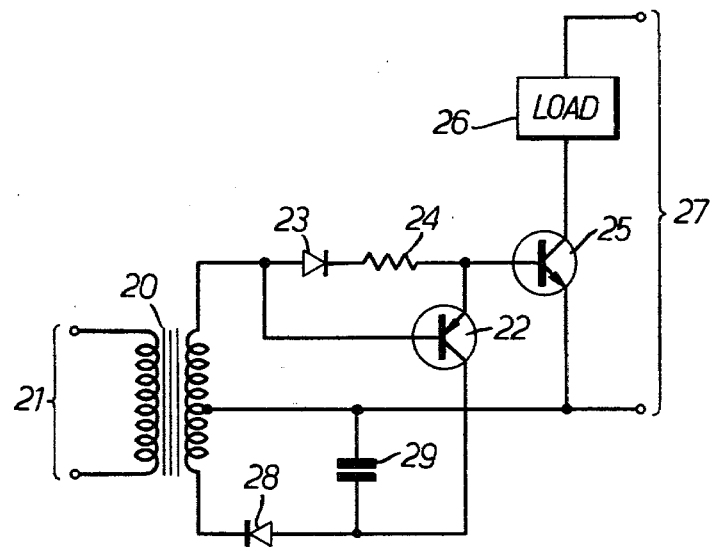

Various circuits have been previously proposed for improving semiconductor switching speeds, two such circuits being shown in FIGS. 1 and 2 of the accompanying drawings.

FIG. 1 shows a known circuit which is sometimes referred to as the Baker clamp. An N.P.N. switching transistor 10 is connected in series via its collector and emitter with a load 11 and this series combination is connected across a power source 12. Input switching signals are applied to terminals 13 and pass through three diodes 14, 15, 16 connected in series as shown, to the base of transistor 10. A fourth diode 17 is connected between the junction of diodes 14 and 15, and the collector of the transistor 10.

In operation, base current for turning transistor 10 on is applied to the terminals 13. The base current is maintained until collector saturation of the transistor is just about to occur. Any increase in current through the diode 14 will be diverted by the diode 17 away from the base of the transistor and into its collector. The turn-off time of transistor 10 is thereby minimized due to the clamping action of diode 17. The disadvantage of this circuit is that this clamping action is only usable over a limited range of collector currents, and that the available improvement in switching speed is limited.

FIG. 2 shows a circuit utilizing a further previously proposed method for improving switching speeds, known as a reverse bias turn-off circuit. A transformer 20 is provided with input terminals 21 connected to its primary winding. The base of a P.N.P. transistor 22 is connected to one terminal of the secondary winding of the transformer 20, and also to the emitter of transistor 22 via a diode 23 and a resistor 24 connected in series. The emitter of transistor 22 is also connected to the base of an N.P.N. transistor 25 which provides a switched path for a load 26 in series with its collector and emitter across a power source 27. A further terminal of the secondary of the transformer 20 is connected via a diode 28 to the collector of transistor 22. A tap on the secondary winding is connected to the emitter of transistor 25 and, via a capacitor 29 to the collector of transistor 22.

In operation, an input switching signal is applied to the terminals 21 and a resultant forward drive pulse from the secondary winding of the transformer 20 charges the capacitor 29 via the diode 28 negatively with respect to the emitter of the transistor 25. The cassation of the drive pulse switches transistor 22 on, which thereby connects the base of transistor 26 to a negative base-emitter voltage provided by the charge on capacitor 29. This negative voltage produces reverse base drive to remove the charge stored in the base-emitter junction of switching transistor 25, and thereby to minimize the turn-off time of the transistor 25. The disadvantage of the circuit of FIG. 2 is that the removal of stored charge is dependent upon the forward drive amplitude of the pulse to the transistor 25, and is limited to a reverse bias voltage that should not exceed the reverse breakdown voltage for the base-emitter junction of the device chosen for transistor 25. Furthermore, the need to provide a reverse base drive for removing the base-emitter stored charge leads to an increased number of components—e.g., the transformer 20.

Figure 3:
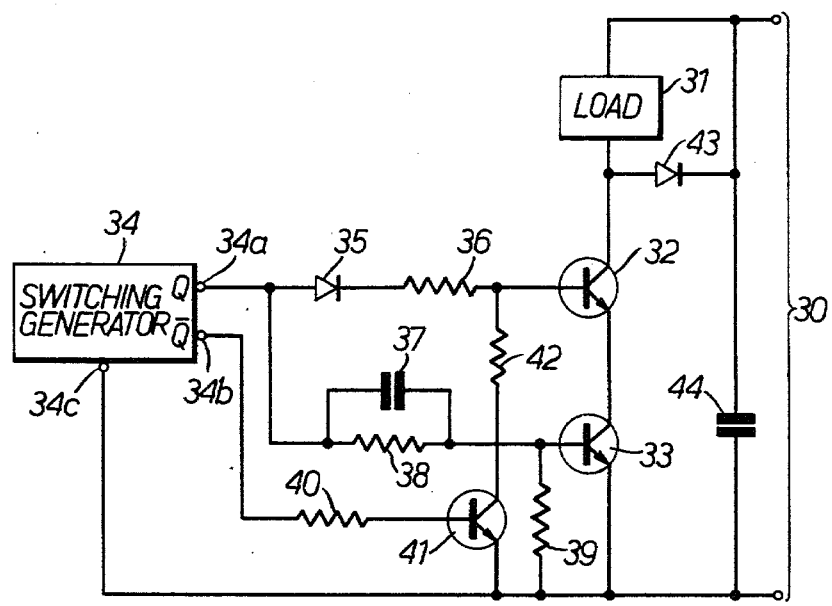
FIG. 3 shows a circuit diagram in accordance with one embodiment of the invention.

FIG. 3 shows a circuit diagram of a switching circuit arranged to switch current from a power source 30, which may be a high voltage source, e.g. 300 V, through a load 31. The power source 30 is connected across a series combination of the load 31, a first N.P.N. transistor 32 and a second N.P.N. transistor 33, each of the transistors providing a switched path between their respective collectors and emitters. A switching generator 34 includes terminals 34a, 34b, 34c for providing switching signals as described hereafter. The terminal 34a is connected to the base of transistor 32 via a diode 35 and a resistor 36 connected in series, and to the base of transistor 33 via a parallel combination of a capacitor 37 and a resistor 38. The base of transistor 33 is also connected to its emitter via a resistor 39. The terminal 34b is connected via a resistor 40 to the base of a third N.P.N. transistor 41 having its collector connected via a resistor 42 to the base of transistor 32, and having its emitter connected to the emitter of transistor 33 and to the terminal 34c.

A commutation diode 43 may be connected in parallel with the load 31 as shown and a capacitor 44, which may have a value of 10 μF for a 300 V power source, may be connected across the power course 30.

The first transistor 32 is chosen to have high voltage and current handling ability, whilst the second transistor 33 is chosen to have a high current rating and fast switching parameters. With a power source of 300 V, the voltage rating of the transistor 33 need be no more than a few tens of volts.

In operation, the switching generator 34 is arranged to provide antiphased switching signals at terminals 34a and 34b as shown by the outputs Q and $\overline{Q}$. If terminal 34b is positive with respect to terminal 34c and terminal 34a is at zero, transistors 32 and 33 are off and transistor 41 is on. The polarities of terminals 34a and 34b are now reversed for a finite time t. Transistors 32 and 33 are switched on allowing current to flow through the load 31, and transistor 41 is switched off. Where the impedance of load 31 has an inductive component, the collector current risetime of transistor 32 is relatively unimportant.

At the end of time t, the polarities of terminals 34a and 34b return to their original states (i.e. terminal 34a zero, terminal 34b positive) and transistor 41 is turned on whilst transistor 33 is turned off. The emitter current of transistor 32 falls to zero at a rate determined by the fall time of the collector of transistor 33 and the transistor 32 is effectively held on during this time by the stored charge in its base region. Once transistor 33 has turned off, the voltage at the emitter of transistor 32 would normally rise and therefore necessitate transistor 33 having a high voltage rating. However, in the illustrated circuit, the collector current of transistor 32 is now diverted into flowing through its collector-base capacitance and via resistor 42 and transistor 41 which is turned on. Resistor 42 is made small enough to prevent the voltage of the base and hence that of the emitter of transistor 32 rising above the maximum rating of transistor 33. The resistor 42 and transistor 41 thereby comprise the above-mentioned voltage limiting means.

Upon the cessation of this collector-base current in transistor 32, the transistor can be regarded as turned off. The fall time of the collector current of transistor 32 is therefore determined by the collector-base capacitance of transistor 32, the impedance of the load 31, the value of the resistor 42, and the effective saturated-on resistance of the transistor 41.

The diode 35 is used to block the reverse base current of transistor 32 and prevents this current from attempting to once more switch on transistor 33 via resistor 38.

Figure 4:
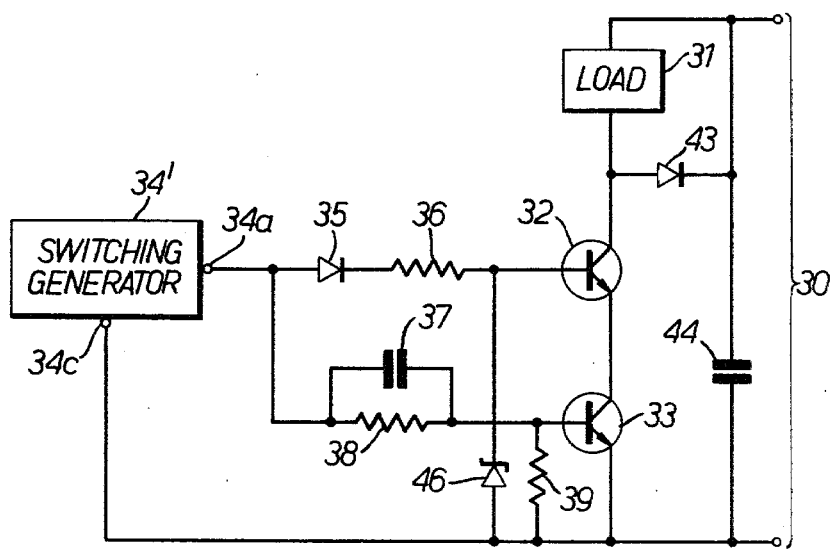
FIG. 4 shows a circuit diagram in accordance with a second embodiment of the invention.

As an alternative to the transistor 41 and resistor 42, the voltage limiting means may comprise any suitable clamping device such as a low voltage avalanche or zener diode connected in similar fashion and preventing excess voltage from being present at the base of transistor 32. FIG. 4 shows a circuit in accordance with such an embodiment of the invention, which circuit is identical to that of FIG. 3 with the exception that transistor 41 and resistor 42 are replaced by a zener diode 46 connected between the base of transistor 32 and the emitter of transistor 33 so as to limit the voltage appearing at the base of transistor 32. As a result, switching generator 34' need only provide one phase of switching signal at terminal 34a, and accordingly terminal 34b and base resistor 40 of the FIG. 3 circuit are not included in this embodiment.

Operation of the FIG. 4 circuit is similar to that previously described with reference to FIG. 3. However, in this case the voltage limiting effect is provided only at the voltage of zener diode 46, which should be set to be no greater than the voltage rating of transistor 33. At the cessation of the switching pulse from switching generator 34', transistor 33 commences to turn off and current that was flowing from the collector to the emitter of transistor 33 now flows through the collector-emitter capacitance of transistor 32 to start removing the charge from the base of transistor 32. This action is more beneficial to the transistor 32 than, for example, the charge removal accomplished by the prior art circuit shown in FIG. 2 since it almost completely prevents reverse bias second breakdown of transistor 32.

Upon the removal of the base-emitter charge of transistor 32, the collector-base junction of this transistor goes into its reverse-recovery mode of operation which is very rapid since this action can be likened to the reverse-recovery action of the P-N junction of a diode. The turn-off time of transistor 32, and hence of the switched load current path, is thereby substantially decreased.

A similar technique may be used for other semiconductor switching devices such as field effect transistors (F.E.T.s).

Figure 5:
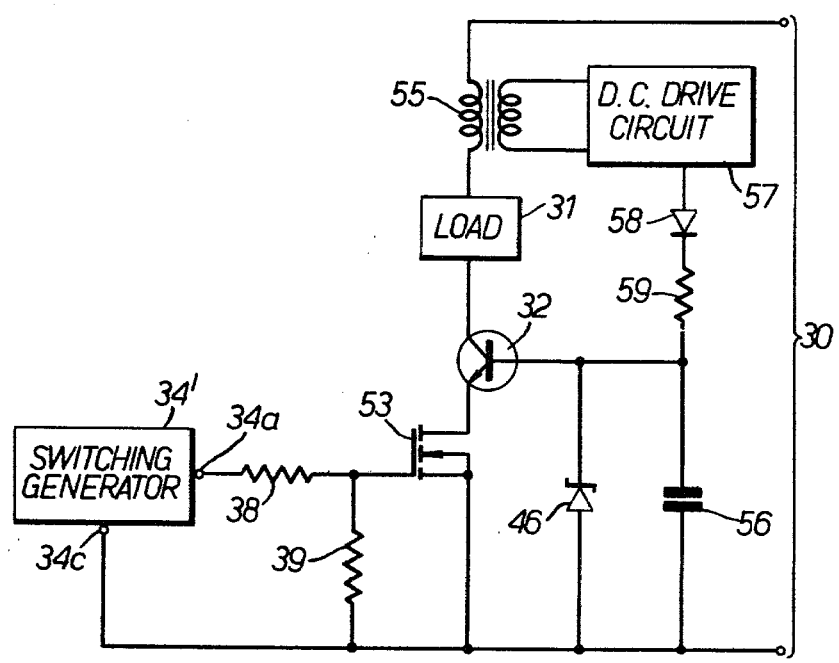
FIG. 5 shows a circuit diagram in accordance with a third embodiment of the invention.

FIG. 5 shows a circuit in which one F.E.T. is used as the high speed switching device, the switching operation of the other switching device being somewhat different to that of FIGS. 3 and 4. Components common to these figures have the same reference numerals. The switching generator 34' provides switching signals through resistor 38 to the gate electrode of a FET 53 (specifically an n-channel enhancement type MOSFET). Resistor 39 is connected between the gate and the source of FET 53. The power source 30 is connected across a series combination of load 31, N.P.N. bi-polar transistor 32 and FET 53. A current transformer 55 may be included at any point in this series combination and its purpose will be explained hereafter.

The base of transistor 32 is connected to a drive arrangement, different to that of FIGS. 3 and 4, in the form of zener diode 46 connected as previously described and a capacitor 56 connected in parallel with the zener diode 46. A D.C. drive circuit 57, which may receive an output of the current transformer 55, if this transformer is included, provides D.C. drive to the base of transistor 32 via a diode 58 and a resistor 59 connected in series.

In operation, only F.E.T. 53 receives switching signals directly from the switching generator 34', transistor 32 being responsive to these signals indirectly by virtue of the change in condition at its emitter. Assuming that conditions are quiescent and that in the absence of a switching signal from generator 34', F.E.T. 53 is off, the base of transistor 32 is at a voltage determined by the leakage current of zener diode 46 (which may alternatively be any other clamping device as discussed previously) and the corresponding voltage drop across resistor 59. For present purposes, it is assumed that drive circuit 57 provides a constant D.C. drive. The gate of FET 53 should be below its threshold voltage and held at this level by the generator 34'.

A positive pulse (switching signal) from the generator 34' to the gate of FET 53 rapidly turns on the FET, pulling the emitter of transistor 32 down towards the reference potential (i.e. that of terminal 34c). This action causes a large current of flow from the capacitor 56, which had previously been charged to the potential of zener diode 46, into the base of transistor 32 driving the transistor into saturation. Base current of transistor 32 is maintained via diode 58 and resistor 59 and is adjusted to keep transistor 32 in saturation. Automatic adjustment may be provided by circuit 57 configured as a proportional drive circuit, which provides D.C. drive proportional to the switched load current. In this case inclusion of current transformer 55 will provide a current-representative signal to circuit 57, which may then include a rectifier/storage capacitor arrangement for producing a peak-current representative drive to transistor 32 from the current-representative signal of transformer 55. Such an arrangement would provide an averaged peak-current drive. Alternatively, an instantaneous peak current drive may be preferred. In any event the drive should include a basic minimum constant D.C. component, even at zero switched load current, plus a component varying in accordance with variation of load current.

When the switching signal from generator 34' is terminated, FET 53 commences to turn off and current that was flowing from the drain to the source of FET 53 now flows through the collector to emitter capacitance of transistor 32 to start removing the charge from its base in a similar manner to that described with reference to FIG. 4.

It will be seen that capacitor 56 charges from the drive circuit 57 via resistor 59 when FET 53 and hence transistor 32 is off. When FET 53 turns on, and hence the potential at the emitter of transistor 32 drops, the capacitor discharges via the base of transistor 32, saturating the transistor. However, since charge can also flow into the capacitor from the base of transistor 32 when FET 53 is turning off, and hence transistor 32 emitter potential is rising, it is envisaged that under certain operating conditions, this charge may be sufficient subsequently to provide the corresponding discharge, and hence the D.C. drive circuit 53 may be dispensed with.

In the circuit of FIG. 5, the FET is used as the fast switching device, and a bi-polar transistor as the other switching device. Although this is a particularly advantageous configuration, making use of the fast switching speed of FETs, any combination of either or both bipolar transistors or FETs may be used. Where an FET is used as transistor 32, the circuits described are particularly advantageous, as it is known that FETs have a parasitic bi-polar transistor effect which introduces a dV/dt limitation to the rate of rise of the source. This becomes a problem at high switching speeds, and ultimately may lead to self-destruction of the device, as a result of the reverse bias second breakdown effect. The removal of charge from the base of transistor 32 (whether bi-polar or FET) as described above prevents this effect and therefore leads to increased reliability in operation.

Although the switching generators 34, 34' are shown as discrete elements, they may readily be constituted by any means for providing suitable base drive switching signals, such as the feedback winding(s) of an inverter transformer in a switching-mode power supply. In certain applications, for example the half-bridge inverter, more than one switching means is required and consequently as many of the switching circuits may be provided as are necessary to switch current through the load.

What is claimed is:

1. A semiconductor switching circuit, comprising
   (a) a voltage source (30);
   (b) a load (31);
   (c) switching means operable in response to switching control signals applied thereto for connecting said load across said voltage source, said switching means including
      (1) first (32) and second (53) semiconductor switching devices connected in series for switching current through said load, said switching devices being arranged to switch together in response to said switching control signals;
      (2) said second switching device having a predetermined voltage rating;
      (3) said first switching device including a switchable path and a control terminal for controlling the switchable path;
   (d) means (55) for providing a current-responsive signal that is a function of the current flowing through said load;
   (e) a D.C. drive circuit (57) responsive to said current-responsive signal for providing to the control terminal of said first switching device a D.C. drive signal that is dependent on the load current; and
   (f) voltage limiting means (46) for limiting the voltage across said second switching device so as not to exceed the voltage rating thereof, and for removed stored charge in said first switching device, thereby to increase the switching speed of said circuit.

2. Apparatus as defined as claim 1, wherein said D.C. drive signal is proportional to said load current.

3. A semiconductor switching circuit as claimed in claim 1, wherein at least one of said switching devices comprises a bi-polar transistor.

4. A semiconductor switching circuit as claimed in claim 1, wherein at least one of said switching devices comprises a field effect transistor.

5. A semiconductor switching circuit as claimed in claim 1, wherein said voltage limiting means comprises a zener diode connected to said first switching device.

6. A semiconductor switching circuit as claimed in claim 1 wherein the drive provided by said D.C. drive circuit can be controlled in response to the peak current through said load.

* * * * *